United States Patent [19]

Belanger, Jr. et al.

[11] Patent Number: 4,812,947
[45] Date of Patent: Mar. 14, 1989

[54] DEVICE FOR DISCHARGING ELECTROSTATIC POTENTIALS

[75] Inventors: Thomas D. Belanger, Jr., Clarendon Hills; Roy L. Johnson, Arlington Heights, both of Ill.

[73] Assignee: GTE Communication Systems Corporation, Phoenix, Ariz.

[21] Appl. No.: 134,482

[22] Filed: Dec. 17, 1987

[51] Int. Cl.⁴ .............................................. H05H 3/00
[52] U.S. Cl. .................................................... 361/220
[58] Field of Search ................................ 361/212, 220

[56] References Cited

U.S. PATENT DOCUMENTS 4,439,809  3/1984  Weight et al. ........................ 361/220

Primary Examiner—L. T. Hix
Assistant Examiner—David Porterfield
Attorney, Agent, or Firm—Anthony Miologos

[57] ABSTRACT

A device for conducting electrostatic potentials to a protection ground is disclosed. The device includes an electrically conductive center section mounted on a substrate mounting device, with the center section electrically connected to the protection ground. First and second electrically conductive bands extend from opposite sides of the center section. During the installation of a ciruoit substrate to the substrate mounting device an associated band is arranged to contact a metalized edge of the circuit substrate providing an electrical path for discharging electrostatic potentials from the circuit substrate to the protection ground.

6 Claims, 2 Drawing Sheets

DEVICE FOR DISCHARGING ELECTROSTATIC POTENTIALS

CROSS-REFERENCES TO RELATED APPLICATIONS

The present application is related to applicants' co-pending application Ser. No. 134,481, titled, ELECTRO-STATIC DISCHARGE DEVICE, having a common inventive entity and a common assignee.

BACKGROUND OF THE INVENTION

This invention relates in general to electrostatic discharge devices and more particularly to an arrangement for discharging electrostatic potentials during the installation of an electrical substrate to a carrier substrate.

In the past few years, the use of plug-in units for electrical components has found favor within the electronics industry. Such plug-in units generally comprise a structure upon which are mounted electrical assemblies or sub-assemblies, the structure being arranged to be plugged in a suitable socket provided on a base chassis. When so plugged the components carried by the plug-in unit are electrically connected in proper circuit relation to other electrical equipment carried by the base chassis.

However, with the development of film circuits, the need for a specialized carrier structure for housing the sub-assembly has disappeared. This is due to the smaller size of a film circuit. Compared to circuits fashioned with discrete components the film circuit is appreciably smaller and lighter. It is not uncommon to have film circuits plugged directly into larger circuit cards or other carrier substrates and in turn the larger substrate plugged into the base chassis.

At present, most installations of a film circuit to a circuit card is done as a permanent installation. Therefore, removal and replacement of a film circuit though not impossible, is a tedious and labor intensive job.

One method for installing electronic substrates to a carrier substrate is taught by applicant's co-pending U.S. patent application titled, SUBSTRATE MOUNTING DEVICE. This arrangement uses guides attached to a carrier substrate, such as a conventional circuit board, to accept and terminate an electronic substrate such as a hybrid film circuit deposited on a ceramic substrate.

During the installation of the above mentioned devices a possibility exists that during handling, one substrate may assume an electrical potential greater than the other. Further, during the installation of the hybrid substrate onto the carrier substrate the possibility also exists of an electrostatic charge building-up, due to the the dissimilar materials used for the guides and the hybrid film circuit. The sudden discharge of such an electrical potential can have catastrophic consequences on the sensitive low voltage components of the hybrid and/or carrier substrate.

It therefor becomes an object of the present invention to provide an arrangement for bringing an electronic substrate to the same potential as a carrier substrate.

SUMMARY OF THE INVENTION

In accomplishing the object of the present invention there is provided an electrostatic discharge device. The device of the present invention includes a center section formed from an electrically conductive material. The center section further includes an aperture for accommodating a threaded fastener, which is used to mount the center section to a substrate mounting device. An L-shaped conductive path extending from the center section electrically connects the center section to a protection ground.

a first semicircular band extends outward from the center section and is electrically connected to the center section. A second semicircular band extends outward from the center section directly opposite the first band and is also electrically connected to the center section. The first and second bands are connected together at respective end portions with each end portion housed within a cut-out area of the substrate mounting device.

The electrostatic discharge device of the present invention is used to advantage during the installation of a circuit substrate to the substrate mounting device. As a circuit substrate is installed on the substrate mounting device the a respective first or second band contacts a metalized edge of the circuit substrate. The band is urged backwards toward the substrate mounting device during installation. This allows the band to compress apply a slight pressure to the circuit substrate edge in the same manner as a wiping contact. As each band is urged back toward the substrate mounting device each respective band end portion travels forward within the cut-out area. This allows the accommodation of each respective band within the cut-out area. During the Installation an electrical path is maintained from the circuit substrate via the associated band the center section and the L-shaped conductive path to the protection ground.

Any electrostatic potentials which may have been present or developed during installation of the circuit substrate are safely dissipated instantly to the protection ground.

BRIEF DESCRIPTION OF THE DRAWINGS

A better understanding of the invention may be had from the consideration of the following detailed description taken in conjunction with the accompanying drawings in which.

DESCRIPTION OF THE PREFERRED EMBODIMENT

Figure 1:
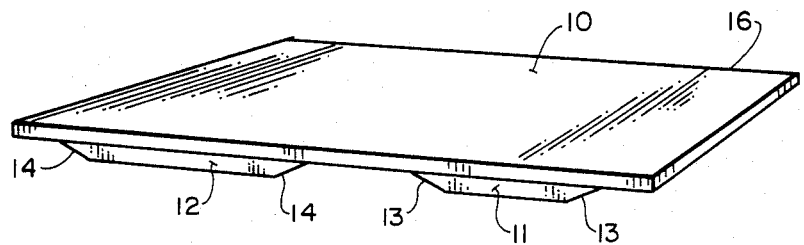
FIG. 1 is a perspective view of a substrate having guide rails used with the present invention.
Figure 2:
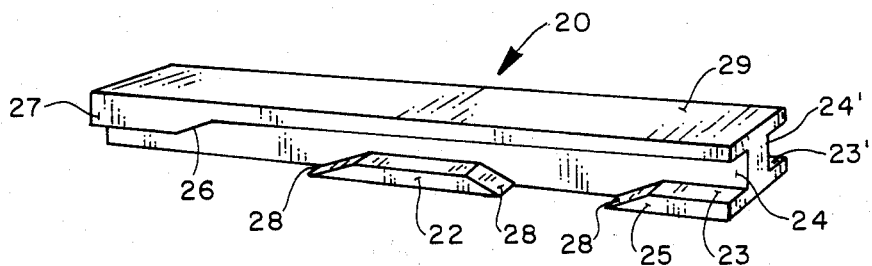
FIG. 2 is a perspective view of a substrate guide used with the present invention.
Figure 3:
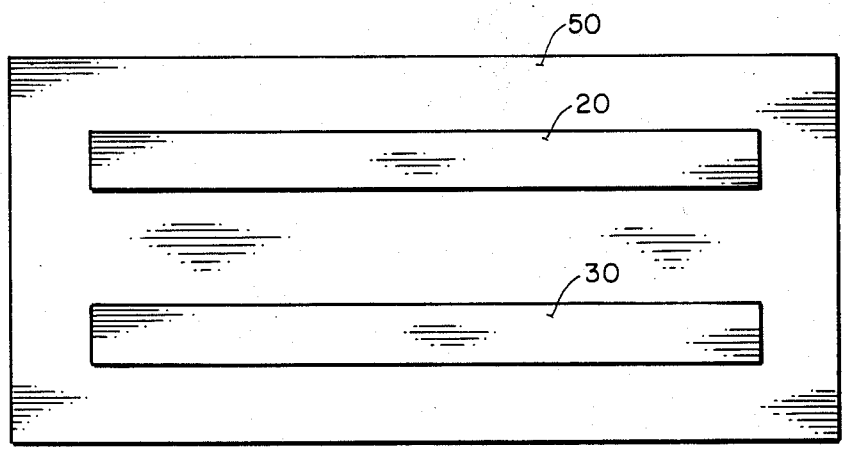
FIG. 3 is a top plan view of the substrate mounting device used with present invention mounted on a carrier substrate.

Turning now to FIGS. 1, 2 and 3 of the included drawings, a device of the type in which the invention is used to advantage is illustrated. A better understanding of the device may be had by referring to applicants co-pending U.S. patent application Ser. No. 877,028, titled SUBSTRATE MOUNTING DEVICE.

The device includes a planar substrate 10 having forward guide rails 11 and rear guard rails 12 attached or molded onto the substrate 10 along the edge of one of the substrates 10 major sides. A similar set of guide rails (not shown) are also positioned on the opposite major side of the substrate. Edges 15 and 16 of substrate 10 include a continuous layer of conductor material electrically connected to a protection ground trace on substrate 10.

Guide 20 is a integrally molded unit comprised of at least one slot or channel, such as channel 24 extending longitudinally along an inner side of guide 20. Channel 24 is defined between a planar top cap or surface 29 and a forward drop guide 23 and rear drop guide 22. Additionally, the channel 24 extends from an opening at the forward end of the guide 20 to a top guide 27 at the rear. Both the forward and rear drop guides include ramped ends 28 to aid in the positioning and removal of the substrate 10. Finally, guide 20 includes a generally planar bottom surface 25 for mounting the guide to a carrier substrate.

A pair of guides 20 and 30 form the substrate mounting device shown in FIG. 3. Guide 30 is a mirror image in structure to guide 20.

The substrate mounting device is attached by any convenient means to the top surface of a carrier substrate 50 such as a circuit card, backplane, or other electrical substrate.

The substrate 10 including forward guide rail 12 and rear guard rail 11 is inserted into channel 24 of guide 20 and pushed forward within the guide. forward rail 12 rides within the channel between the forward drop guide 23, rear drop guide 22 and the top cap 29 until guide rails 11 and 12 fall into respective openings made by drop guides 23 and 22.

Figure 4:
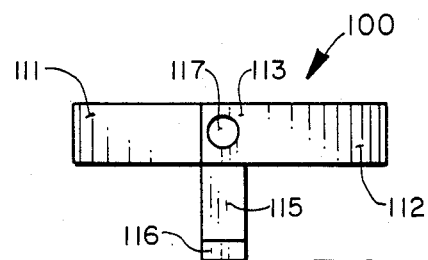
FIG. 4 is an elevational view of the device of the present invention.
Figure 5:
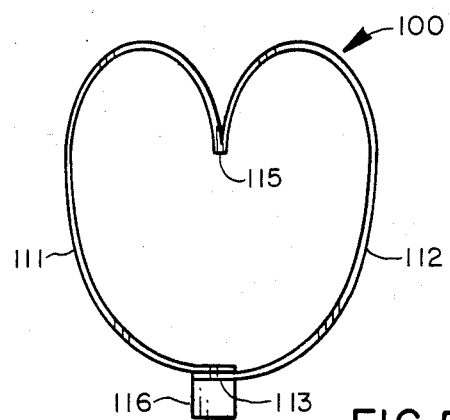
FIG. 5 is plan view of the device of FIG. 4.
Figure 6:
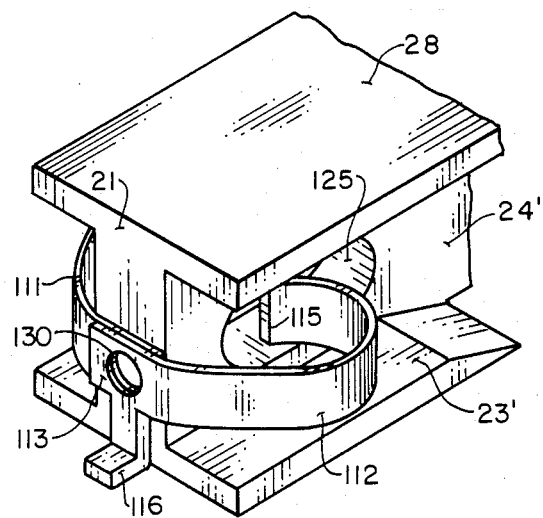
FIG. 6 is a view of the device of the present invent to a substrate guide in accordance with the present invention.

Turning now to FIGS. 4 and 5 the electrostatic discharge device of the present invention is illustrated. The device 100, is comprised of a band of conductive material oriented as two semicircular band portions 111 and 112 extending from a planar front end 113 to an integrally joined end 115. The front end 113 includes, a leg 115 extending downward from center section 113 and foot 116 connected to leg 115. The band portions 111 and 112 of device 100 are composed of a material having good spring like qualities as well good electrically conductive qualities.

Leg 115 is composed of the same conductive material as band portions 111 and 112 and extends an electrically conductive path from the front end 113 of device 100 to foot 116. Foot 116 is also composed of the same electrically conductive material as leg 115. An orifice 117 is centrally located on front end 113 and is used to mount the device 100 to guide 20 and/or 30.

Turning now to FIG. 3, the installation of the device 100 to guide 20 will be illustrated. It will be appreciated by those skilled in the art that the device can be also mounted to guide 30 and that the following explanation of the device mounted to only guide 20 is done for clarity and the invention is not limited thereto. As can be seen the device 100 is mounted to the front of guide 20 with the center section 113 against surface 21 of guide 20. A fastener 130 is inserted into orifice 117 which engages a threaded bore on surface 21 (not shown) mounting the device to guide 20, as well as connecting band portions 111 and 112 together. With device 100 mounted on guide 20, band portions 111 and 112 extend into respective channel openings and foot 116 rests on the surface of carrier substrate 50. Foot 116 which functions as a terminal tab, is electrically connected to a protection ground trace (not shown) on carrier substrate 50. The electrical connection between foot 116 and the protection ground trace can be accomplished by any one of many convenient methods such as soldering, or press-fitting. With foot 116 electrically connected to the protection ground, band portions 111 and 112 of device 100 assumes the electrical potential of the protection ground.

When substrate 10 is installed into guide 20 metalized edges 16 of substrate 10 contacts band portion 111 of device 100. As substrate 10 is inserted onto guide 20, band portion 111 is urged back into channel 24 until it travels into cut-out area 125. The semicircular shape of band portions 111 and 112 as well as the spring like quality of the band material allows the band portions to flex inward and toward the channel. Band end 115, were band portions 111 and 112 are connected, travels forward into cut-out area 125 thereby allowing the accommodation of the compressed band within the cut-out area. The inward travel of each band portion provides a wiping contact action against the metalized surface 16 of substrate 10 as the substrate travels within the channel of guide 20.

Any destructive electrical potentials which may have built up on the substrate are safely conducted to protection ground via band portion 111, leg 115 and foot 116. Similarly, any static voltages which may have built up due to the insertion process of the substrate 10 into guides 20 are also dissipated by device 100. With the substrate fully installed on the guide, protection ground remains connected between substrate 10 and the carrier substrate 50. This provides the electrical path for extraneous voltage or current surges to be safely dissipated from the electrical circuitry.

When carrier substrate 10 is withdrawn, band portions 111 and 112 spring back to their original position and assume a position to contact the substrate during the next insertion.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An electrostatic discharge device arranged to be used with a substrate mounting device, said substrate mounting device including a cut-out area, said electrostatic device comprising:

a center section having an electrically conductive surface, said center section including means for mounting said center section to a substrate mounting device, and means for electrically connecting said center section to a protection ground;

a first semicircular band extending from said center section, said first band terminating at an end portion accommodated in said cut-out area, said first band electrically connected to said center section;

a second semicircular band extending from said center section directly opposite said first band, said second band terminating at an end portion accommodated in said cut-out area, and said second band electrically connected to said center section; and responsive to the installation of a circuit substrate to said substrate mounting device, said first band contacts an edge of said circuit substrate allowing said first band to electrically electrically connect to said circuit substrate thereby, providing an electrical path for discharging electrostatic potentials from said circuit substrate to said protection ground and alternatively, responsive to the installation of a circuit substrate to said substrate mounting device, said second band contacts an edge of said circuit substrate allowing said second band to electrically connect to said circuit substrate thereby, providing an electrical path for discharging electrostatic potentials from said circuit substrate to said protection ground.

2. The electrostatic discharge device as claimed in claim 1, wherein: said first and second bands are integrally joined together at a respective end portion and said end portions are accommodated within said substrate mounting device cut-out area.

3. The electrostatic discharge device as claimed in claim 1, wherein: said substrate mounting guide includes a threaded bore and said means for mounting said center section is an aperture extending thru said center section arranged to accommodate a threaded fastener therein, said threaded fastener arranged to engage said threaded bore securing said electrostatic discharge device to said substrate mounting device.

4. The electrostatic discharge device as claimed in claim 1, wherein: said means for electrically connecting said center section to a protection ground includes a leg portion having one end integrally joined and extending downward from said center section and a foot portion extending horizontally from a second opposite end of said leg portion, said leg and said foot portion each are composed of an electrically conductive material as an integral unit with said foot portion arranged to be electrically connected to said protection ground.

5. The electrostatic discharge device as claimed in claim 2, wherein: said first and second bands are urged back toward said circuit mounting device during installation of a respective circuit substrate, and said terminating portion is urged forward within said cut-out area providing a compressive force to said circuit substrate edge, substantially housing each band within said cut-out area.

6. An electrostatic discharge device arranged to be used with a substrate mounting device, said substrate mounting device including a cut-out area, said electrostatic device comprising:

a center section having an electrically conductive surface, said center section including means for mounting said center section to a substrate mounting device, and means for electrically connecting said center section to a protection ground;

a first semicircular band extending outward from said center section, said first band terminating at an end portion, said first band electrically connected to said center section;

a second semicircular band extending outward from said center section directly opposite said first band, said second band terminating at an end portion, and said second band electrically connected to said center section;

said first and second bands are integrally joined together at respective end portions and each of said first and second bands end portions are arranged to be accommodated within said substrate mounting device cut-out area; and, responsive to the installation of a circuit substrate to said substrate mounting device, aid first band contacts an edge of said circuit substrate allowing said first band to electrically connect to said circuit substrate thereby, providing an electrical path for discharging electrostatic potentials from said circuit substrate to said protection ground and alternatively, responsive to the installation of a circuit substrate to said substrate mounting device, said second band contacts an edge of said circuit substrate allowing said second band to electrically connect to said circuit substrate thereby, providing an electrical path for discharging electrostatic potentials from said circuit substrate to said protection ground.

* * * * *